United States Patent [19]

Resneau et al.

[11] 4,404,745
[45] Sep. 20, 1983

[54] PROCESS FOR SEALING VHF COMPONENT IN CASE

[75] Inventors: Jean C. Resneau; Jean Doyen; Robert Ribier, all of Paris, France

[73] Assignee: Thomson-CSF, Paris, France

[21] Appl. No.: 238,600

[22] Filed: Feb. 26, 1981

[30] Foreign Application Priority Data

Feb. 26, 1980 [FR] France .................. 80 04208

[51] Int. Cl.³ .............................. H05K 3/30
[52] U.S. Cl. ...................... 29/841; 29/589; 29/832; 29/827
[58] Field of Search ............... 174/52 H, 52 PE; 29/827, 589, 832, 841; 264/61; 357/80, 81

[56] References Cited

U.S. PATENT DOCUMENTS

| 3,404,213 | 10/1968 | Brookover | 174/52 PE |
| 3,676,569 | 7/1972 | Thompson | |
| 3,683,241 | 8/1972 | Duncan | 174/52 H X |
| 3,769,560 | 10/1973 | Miyake et al. | 174/52 H X |
| 3,872,583 | 3/1975 | Beall et al. | 29/827 |
| 4,137,628 | 2/1979 | Suzuki | 29/827 |
| 4,297,722 | 10/1981 | Nagahama et al. | 174/52 H X |

FOREIGN PATENT DOCUMENTS

| 2026741 | 12/1970 | Fed. Rep. of Germany . |
| 2118752 | 7/1972 | France . |
| 1369627 | 10/1974 | United Kingdom . |
| 1474902 | 5/1977 | United Kingdom . |

Primary Examiner—Francis S. Husar
Assistant Examiner—Carl J. Arbes
Attorney, Agent, or Firm—Oblon, Fisher, Spivak, McClelland & Maier

[57] ABSTRACT

A process of construction of a device for hermetic sealing in a case comprising a sealed ceramic crossover formed by a metal conductor, without having recourse to the technology of cast alumina, which is delicate and costly, and without using sealing glass which is undesirable for very high frequencies. The process comprises the manufacture of molded parts by pressing green alumina to which binders have been added, so as to obtain a case bottom and a frame, which is metalized only after previous firing at 1000° C., using the molybdenum-manganese deposit by silk-screen printing, then which is sintered at the normal temperature of alumina at 1500° C.

3 Claims, 2 Drawing Figures

PROCESS FOR SEALING VHF COMPONENT IN CASE

BACKGROUND OF THE INVENTION

1. Field of the Invention

The invention relates to a process for hermetically sealing very-high-frequency components in a case in the form of a device comprising metal conducting crossovers.

2. Description of the Prior Art

It is known that sealed crossovers formed by glass beads cannot be used for very high frequencies because of the energy losses in the glass. Recourse is then had to crossovers between two pieces of ceramic which are for example the bottom and the side walls of a component case. Two principal cases are to be considered:

First case: The parts are made from an insulating polycrystalline ceramic for example from sintered alumina, which forms a high-grade insulator for very high frequencies. In this case, the conductors are provided for example in the form of metalizations deposited on the alumina of the bottom of the case. Generally this bottom forms a plate with dimensions greater than that of the bottom properly speaking, this latter being limited by a frame forming the side walls of the case. The metalizations extend beyond the walls and pass sealingly between frame and plate, thanks to sealing generally using glass having a high softening temperature, the metalizations being provided so as to withstand this operation without damage, for example by using a molybdenum and manganese alloy.

This method has the disadvantage of introducing glass, which even in small quantities is a source of high-frequency losses at the crossovers.

Second case: The parts are made from green ceramic before assembly of the plate and the frame forming the bottom and the edges of the case. There is in fact known the relatively delicate technology of cast, so-called plastic, alumina made from tapes having a thickness of about a millimeter (during subsequent sintering, the tape undergoes considerable shrinking and its thickness practically does not exceed a millimeter).

The plate and the frame are formed by cutting out a tape of cast alumina. To obtain a case whose edges have a height greater than a millimeter, it is then necessary to superimpose two or more tapes.

The metallization obtained by silk-screen printing of the conductors of the case is followed by a heat treatment to remove the volatile solvents of the paste to be silk-screen printed.

The parts are then assembled, maintained in contact with a light pressure, then sealed by sintering at about 1500° C.

Hermetic sealing is ensured by the diffusion of alumina and metal between the contiguous parts during sintering.

The disadvantages, in the second case, result from the high cost of the technology of cast alumina, from the limitation of the height of the edges of the case when a single frame is used drawn from a tape of cast alumina, finally from the considerable shrinkage of the parts after sintering of the ceramic.

The invention tends to eliminate the disadvantages of prior methods.

SUMMARY OF THE INVENTION

The process of the invention comprises the assembly of a first ceramic part and of a second ceramic part of the same kind, the second part comprising on its large face at least one metalization made from an alloy which is refractory at the sintering temperature of the ceramic, the metalization being intended to form a conducting crossover on the contact surface between the two parts.

It is principally characterized in that is comprises at least a first separate step for heat treating the parts at a temperature less than the normal sintering temperature of the ceramic, and a second heat treating step at the normal sintering temperature, taking place only after assembly of the two parts, held one against the other during the second step with a pressure at least equal to 50 g/cm$^2$.

DESCRIPTION OF THE DRAWINGS

Other characteristics of the invention will be clear from the following description, given by way of non-limiting example, and illustrated by the accompanying figures in which.

DESCRIPTION OF THE PREFERRED EMBODIMENT

Figure 1:
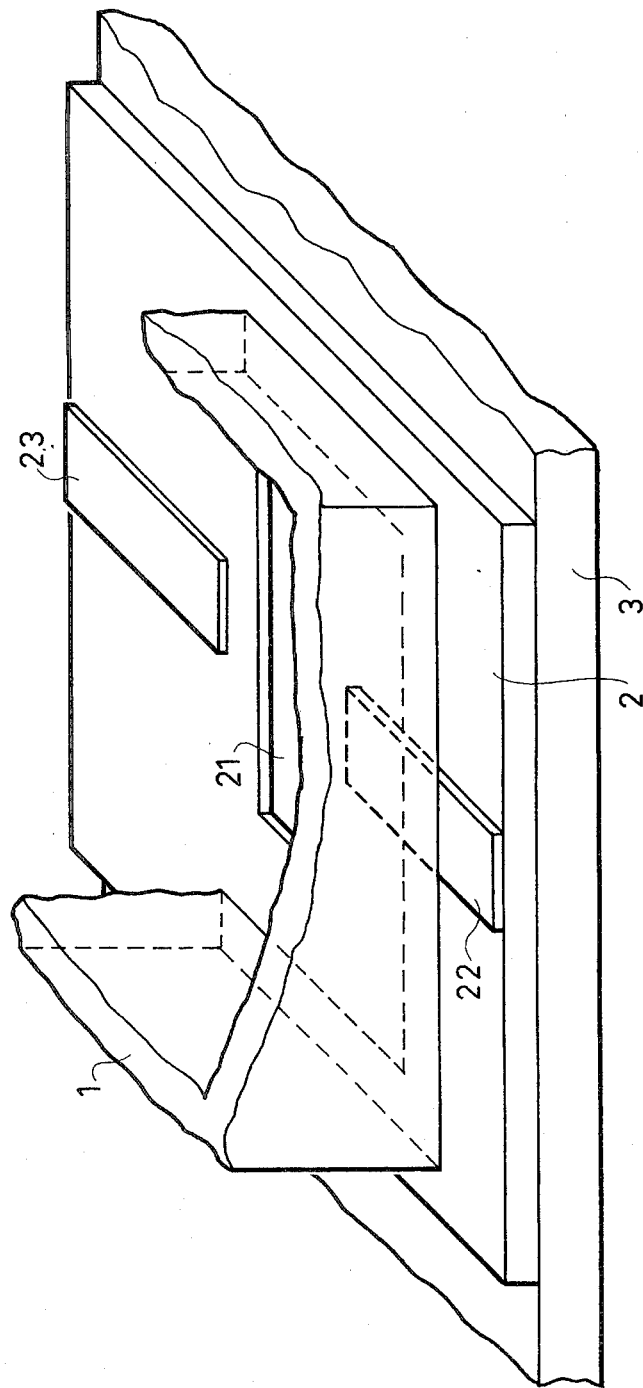
FIG. 1 is a perspective of a part of a device formed by the process of the invention.
Figure 2:
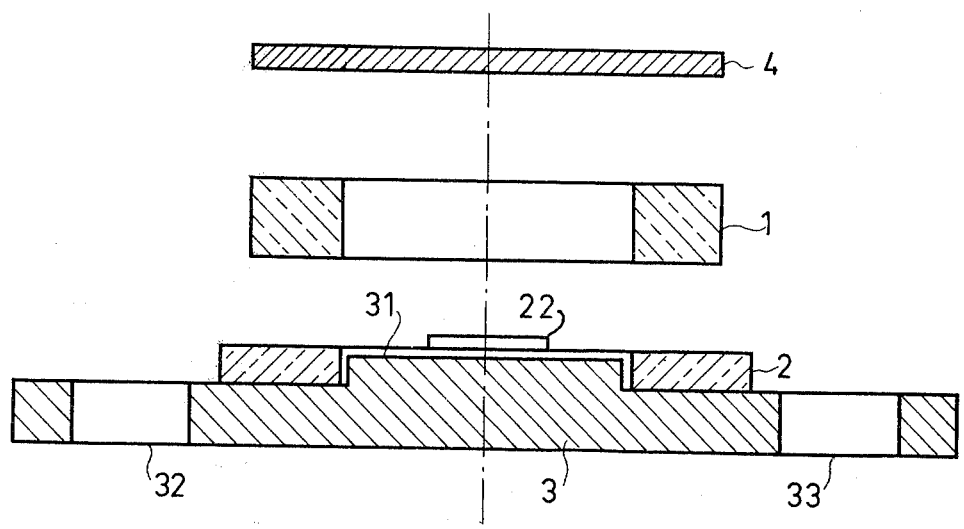
FIG. 2 is an exploded diagram of a case in cross-section corresponding to the construction of FIG. 1.

In the example described and shown in FIGS. 1 and 2, a first ceramic part of the case is a frame 1 made from alumina, a second part being a plate 2 made from alumina of the same type, the two parts having undergone before assembly the same treatment at a temperature less than 1500° C., for example 1000° C.

Plate 2 comprises a central window 21, for grounding the component to be sealed in the case. The ground of the case is formed by a relatively thick plate 3, for example 1 mm for a plate 2 having a thickness of 0.6 mm. This plate, for example made from gold-plated copper, is brazed to plate 2 which ensures the hermetic seal about window 21. Plate 3 comprises for example a raised portion 31 which fits into the window 21 of plate 2, to facilitate connection of the component to ground.

Plate 2 comprises further two metalizations 22 and 23, for example made from a molybdenum and manganese alloy in a layer of a thickness of 10 microns. Other metals or alloys refractory at a temperature of 1500° C. may be used, for example tungsten. The deposit of such a metalization may be effected by any conventional means, for example by means of silk-screen printing, for a thickness of 10 microns. The thickness may vary from a few microns in the case of a vacuum evaporation deposit to thirty microns or so in the case of a silk-screen printed deposit.

The process comprises for example the following steps:

(a) Manufacture of parts from green alumina by the conventional technology of preparing pressure-molded parts from green ceramic to which binders have been added; it comprises the following operations:

grinding the alumina for 24 hours for example in an aqueous medium, using conventional alumina-coated equipment and corindon balls;

after drying, mixing the alumina powder with an organic binder intended to facilitate the shaping of the parts;

pressing the parts in the molds.

(b) Heat treating step at 1000° C. for a period varying from one to a few hours.

(c) Depositing the metalizations 22 and 33 by silk-screen printing by means of a silk-screen printing paste containing molybdenum and manganese, for example, or else tungsten or another refractory and good electricity conducting material on plate 2; if necessary the opposite face of plate 2 and the upper part of frame 1 are metalized over the whole of their surface by the same method; the thickness of the metalizations is between 10 and 40 microns; oven-drying the whole at 100° C. to eliminate the solvents from the silk-screen printing paste.

(d) Assembly of the parts comprising superimposition of frame 1 and plate 2, centering of frame 1 and compressing by means forming part of the baking oven or not.

(e) Sintering step at 1500° C. for a period varying from one to a few hours.

(f) Depositing, on the lower and upper faces of the assembly, metalizations for facilitating brazing with a cover 4 made from an iron, nickel and cobalt alloy (Kovar) and plate 3, if these metalizations were not provided in step (c).

(g) Brazing plate 2 to plate 3, for facilitating if need be the removal of the heat released by the electronic component, in the case of high power, and in any case for fixing the device by use of perforations 32 and 33 provided outside the hold of plate 2 on plate 3.

(h) Mounting of the electronic component, for example a transistor, by soldering to metalizations 22 and 23 and to the raised portion 31.

(i) Brazing of cover 4 on frame 1 with a nickel filler.

The invention is applicable to the manufacture of a three-plate line, comprising as is known, two ground planes insulated by a dielectric, for example ceramic, from a central conductor. The ceramic uses for example alumina, the central conductor being able to be deposited only on one of the intermediate ceramic plates, between the first and the second heat-treating steps. Depositing of the metal layers intended to play the role of ground planes only takes place after the second step.

What is claimed is:

1. A process for the hermetic sealing of a very-high-frequency component in a case, said process comprising the steps of:

manufacturing of a first and a second part from green alumina by grinding, drying and pressing of said parts after addition of organic binders;

heating said first and second manufactured parts at 1000° for a period of time greater than one hour;

depositing by silk-screen printing of refractory metalizations made from an alloy refractory at the sintering temperature of said green alumina on the large face of one of said parts in order to form conducting crossovers on the contacting surface of said first and second parts and stove-drying said first and second manufactured parts at 100° C.;

positioning and assemblying said first and second parts and compressing said first and second parts together; and heating said assembled parts at 1500° C. for a period of more than one hour.

2. A process as claimed in claim 1, comprising the further steps of:

depositing of metalizations on the faces of said assembly of parts in order to prepare said assembly of parts for soldering of a cover and a heat-dissipation plate onto said assembly; and mounting of said electronic component to be hermetically sealed and finishing of said device.

3. A process as claimed in claim 1, wherein said first and second parts are respectively a frame intended to form the side walls and a plate intended to form the bottom of an electronic component case.

* * * * *